(12) United States Patent
Yamazoe et al.

(10) Patent No.: US 7,009,890 B2
(45) Date of Patent: Mar. 7, 2006

(54) NON-VOLATILE SEMICONDUCTOR MEMORY ARRAY AND METHOD OF READING THE SAME MEMORY ARRAY

(75) Inventors: Takanori Yamazoe, Kokubunji (JP); Hiroshi Yoshigi, Hinode (JP); Takeo Kanai, Kodaira (JP)

(73) Assignees: Hitachi, Ltd., Tokyo (JP); Hitachi ULSI Systems Co., Ltd., Kodaira (JP)

( * ) Notice: Subject to any disclaimer, the term of this patent is extended or adjusted under 35 U.S.C. 154(b) by 475 days.

(21) Appl. No.: 10/317,087

(22) Filed: Dec. 12, 2002

(65) Prior Publication Data

US 2003/0177301 A1    Sep. 18, 2003

(30) Foreign Application Priority Data

Mar. 18, 2002 (JP) .............................. 2002-074049

(51) Int. Cl.
*G11C 16/00*    (2006.01)

(52) U.S. Cl. ............................ 365/189.01; 365/185.11; 711/103; 711/156

(58) Field of Classification Search ................ 711/156, 711/103, 5; 365/185.33, 185.11, 185.24, 365/185.29, 230.03, 218, 189.01, 189.05
See application file for complete search history.

(56) References Cited

U.S. PATENT DOCUMENTS

| | | | | |
|---|---|---|---|---|
| 5,422,856 A * | 6/1995 | Sasaki et al. | .......... | 365/230.03 |
| 5,455,789 A * | 10/1995 | Nakamura et al. | ..... | 365/185.17 |
| 5,499,212 A * | 3/1996 | Amanai | ....................... | 365/218 |
| 5,986,965 A * | 11/1999 | Lee | ....................... | 365/230.06 |
| 6,195,294 B1 * | 2/2001 | Ayukawa et al. | ...... | 365/189.04 |
| 6,414,878 B1 * | 7/2002 | Matsubara et al. | .... | 365/185.33 |
| 6,538,924 B1 * | 3/2003 | Dono et al. | ............ | 365/185.08 |
| 6,590,809 B1 * | 7/2003 | Yamazoe et al. | ........ | 365/185.1 |
| 6,667,905 B1 * | 12/2003 | Dono et al. | ............ | 365/185.08 |
| 2002/0114194 A1 * | 8/2002 | Kunori | ................... | 365/185.33 |
| 2003/0161182 A1 * | 8/2003 | Li et al. | ................. | 365/185.02 |
| 2004/0210729 A1 * | 10/2004 | Horii et al. | .................. | 711/156 |

OTHER PUBLICATIONS

Brian Dipert and Markus Levy, Designing with Flash Memory, Annabooks, Apr. 1994, pp 321, 349-371.*

* cited by examiner

*Primary Examiner*—Hong Kim
(74) *Attorney, Agent, or Firm*—Miles & Stockbridge P.C.

(57) ABSTRACT

A non-volatile semiconductor memory EEPROM is usually deteriorated depending on the number of times of program and erase operations and application years thereof. A read operation rate of the EEPROM is generally specified to the operation rate considering deterioration of memory and even in the case where the number of times of program and erase operations is rather small and application years are also rather small, the read operation has been conducted at the read operation rate specified considering deterioration of memory. Moreover, when deterioration of memory is advanced exceeding the specified deterioration, the read operation is now disabled in the worst case. In order to overcome such problem, the reference memories are allocated for every erase and program unit block in the EEPROM memory array, the reference memories are also programmed and erased whenever the memories in the block are erased and programmed and the read timing of memory is generated from the read timing of these reference memories. Moreover, the read timing of the reference memories is outputted as an external interface.

13 Claims, 13 Drawing Sheets

NON-VOLATILE SEMICONDUCTOR MEMORY ARRAY AND METHOD OF READING THE SAME MEMORY ARRAY

FIELD OF THE INVENTION

The present invention relates to reference memories provided in a non-volatile semiconductor memory array to conduct erase and program operations and particularly to a method of reading a memory by utilizing the reference memories in the memory array.

BACKGROUND OF THE INVENTION

An example of structure of memory array of the existing electrically erasable and programmable ROM (EEPROM) is illustrated in FIG. 1. As illustrated in FIG. 1, a memory array is formed of a plurality of blocks, each of which is consisting of a unit block for erase and program operation. FIG. 2 illustrates a layout of the internal circuit of block. Each block is usually composed of one byte (8 bits) to a plurality of bytes. In the case of EEPROM, one bit is composed of a switch transistor and a memory transistor. FIG. 2 illustrates a block of the one byte structure.

A structure of the MONOS (Metal Oxide Nitride Oxide Semiconductor) type EEPROM and concept of erase and program operations thereof are illustrated in FIG. 3 and FIG. 4. In the erase operation illustrated in FIG. 3, a negative high level voltage Vpp is applied to a gate of a memory transistor and holes are injected to a nitride film from a p-well to reduce a threshold voltage (Vth) of a memory transistor. On the contrary, in the write operation, a negative high voltage Vpp is applied to the p-well and electrons are injected to the nitride film to raise Vth of the memory transistor in order to store a binary data in the memory transistor.

A profile of change of Vth of the memory transistor is illustrated in FIG. 5. It is already known that after the erase and reprogram operations have been repeated and changes by aging are detected, the Vth of memory transistor comes close to the initial Vth. Therefore, an electrically reprogrammable EEPROM is limited in the number of times of reprogram operations and in the application years. Such limitation will be explained in more detail. When erase Vth in FIG. 5 is deteriorated and it comes close to the initial Vth, a drain current Ids of the memory transistor is reduced. Usually, when the read operation is executed, the initial Vth is applied as a gate voltage of memory.

Meanwhile, in the read operation of EEPROM, the bit line is charged through Vcc as illustrated in FIG. 6 and FIG. 7 and thereafter a voltage is applied to the switch and gate of the memory transistor to turn ON the memory transistor. When a memory is in the erase "1" state, voltage drop of the bit line is detected by discharging the bit line. When the memory is in the program "0" state, voltage drop of the bit line is never generated.

Deterioration of erase Vth and reduction of memory transistor Ids mean that the voltage detection period of bit line is extended. Usually, when the specification of read time is determined, it is determined by estimating deterioration of the erase Vth of this memory transistor. With the specification of this read period, the read data is determined by receiving a read signal from external control or the like.

When the read time is determined as explained above, even if Vth of memory transistor is almost not deteriorated due to the number of times of reprogram operation and application years are rather small, the read time has the relationship of tRD≧y (ns) as illustrated in FIG. 7 and the read operation is executed within the read period when the Vth is deteriorated. Namely, the specification of read time with the read signal has been fixed. Moreover, the number of times of reprogram operation and application years of EEPROM have been restricted with deterioration of Vth and limitation on the read time.

When the number of times of reprogram operation and application years are small in the electrically reprogrammable EEPROM, here lies a problem that a read operation rate is rather low due to the specification of fixed read period assuming deterioration of Vth of memory transistor while the read operation can be executed at a high speed.

SUMMARY OF THE INVENTION

It is therefore an object of the present invention to provide a non-volatile semiconductor memory array provided with a read timing generation circuit which can solve the problems explained above that there are restrictions on the number of times of reprogram operations, application years and read time and can vary the read timing of the memory depending on the number of times of reprogram operation and application years of the relevant memory by generating a wait signal to control the read timing.

In view of solving the problems explained above, a reference memory to generate the read timing of memory is provided for each block to execute the erase and program operations. Moreover, this reference memory executes the reprogram and erase operations whenever the memory is reprogrammed to always maintain the memory in the ease condition. Moreover, the read timing generated in this reference memory is outputted to the external circuits as a wait signal and thereby the read timing can be notified to an external controller or the like to make access to these memories.

Moreover, the initial Vth of this reference memory is set a little higher than the Vth of memory to acquire a read time margin. Otherwise, the initial Vth of reference memory is usually equal to that of memory and can be obtained by providing a read margin by changing the threshold of a sense amplifier of the reference memory.

DESCRIPTION OF THE PREFERRED EMBODIMENTS

Figure 1:
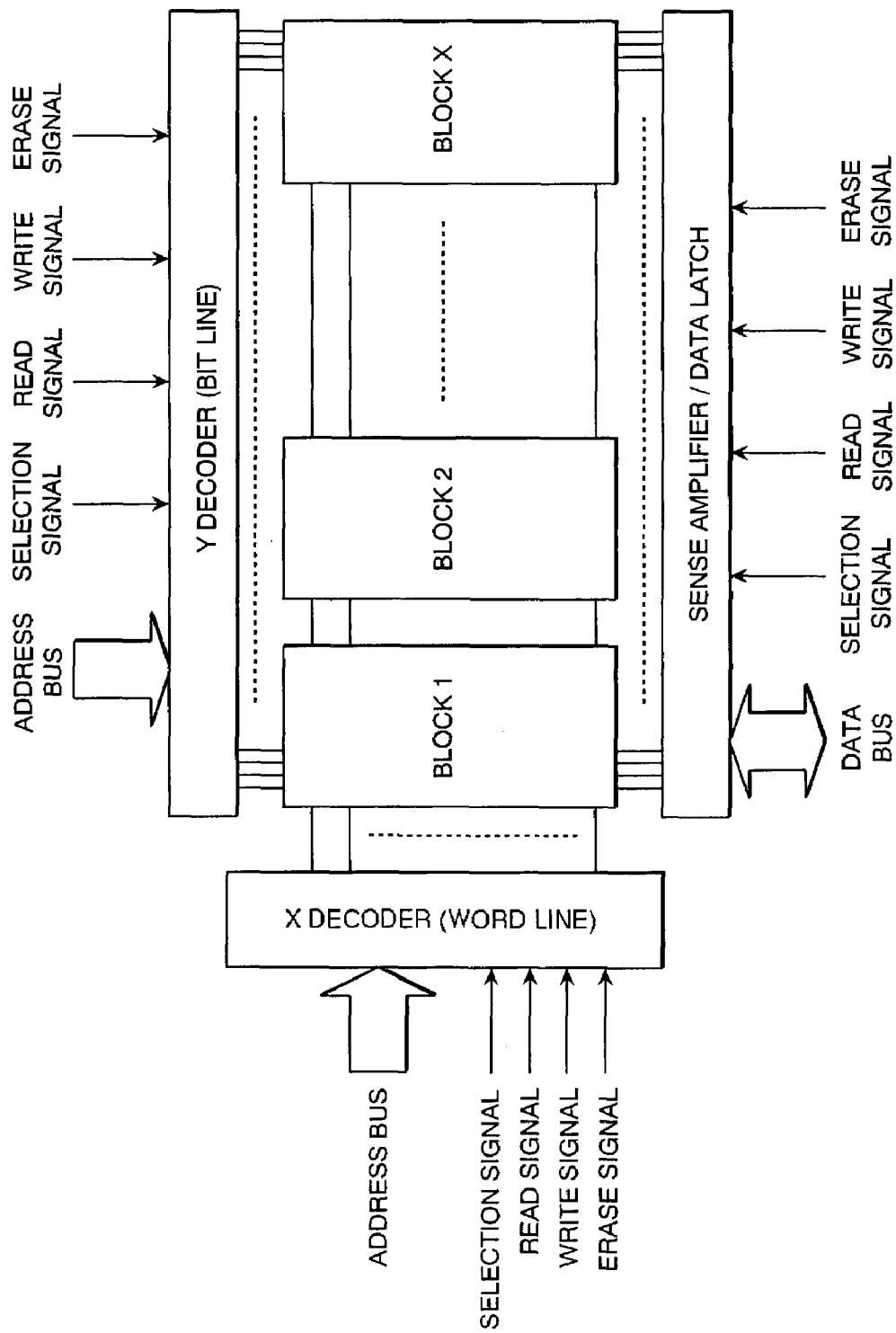
FIG. 1 is a structural diagram of an EEPROM memory array.

The like elements are designated with the like reference numerals throughout the drawings of embodiments.

Figure 2:
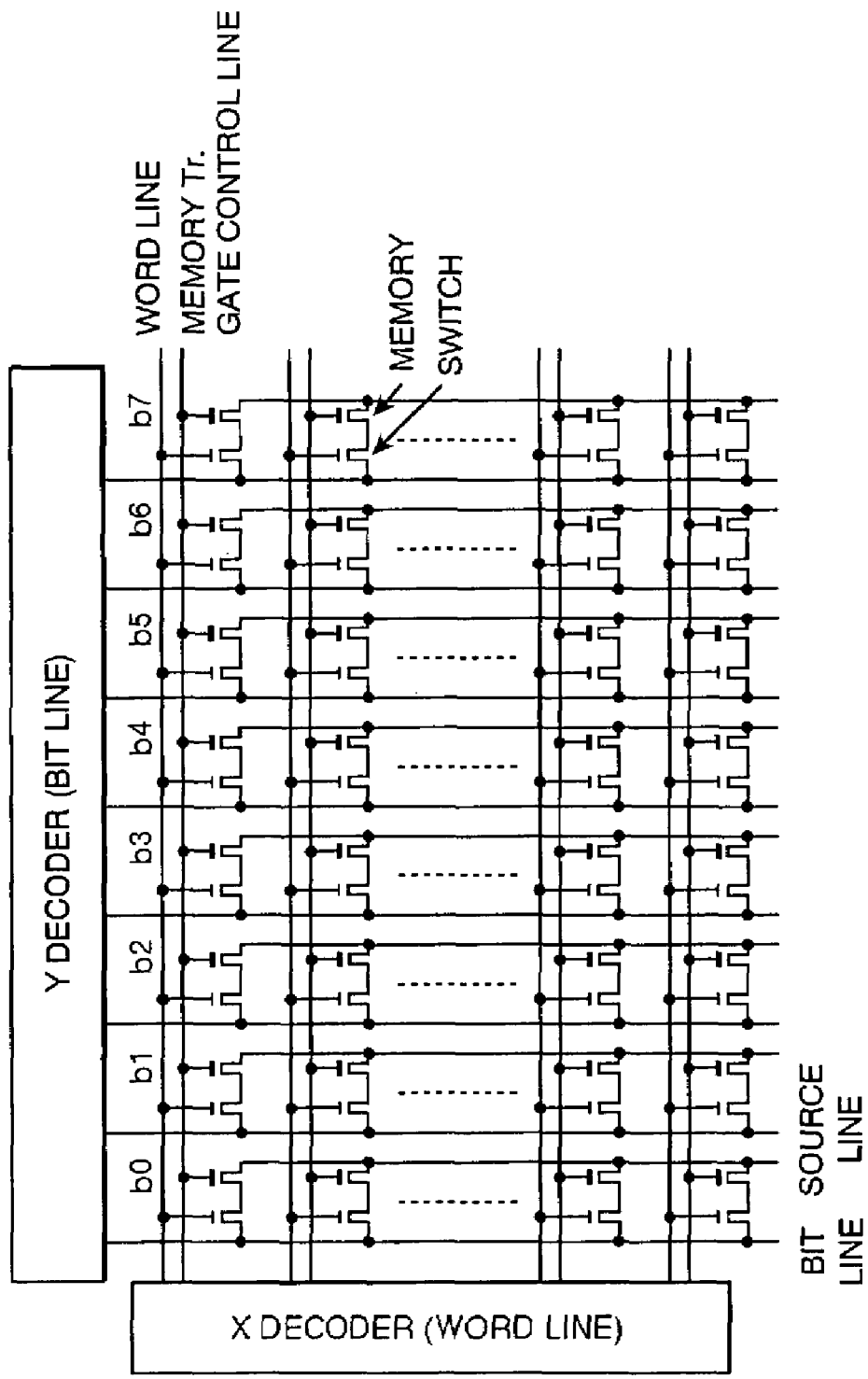
FIG. 2 is a structural diagram of blocks in the EEPROM memory array.
Figure 3:
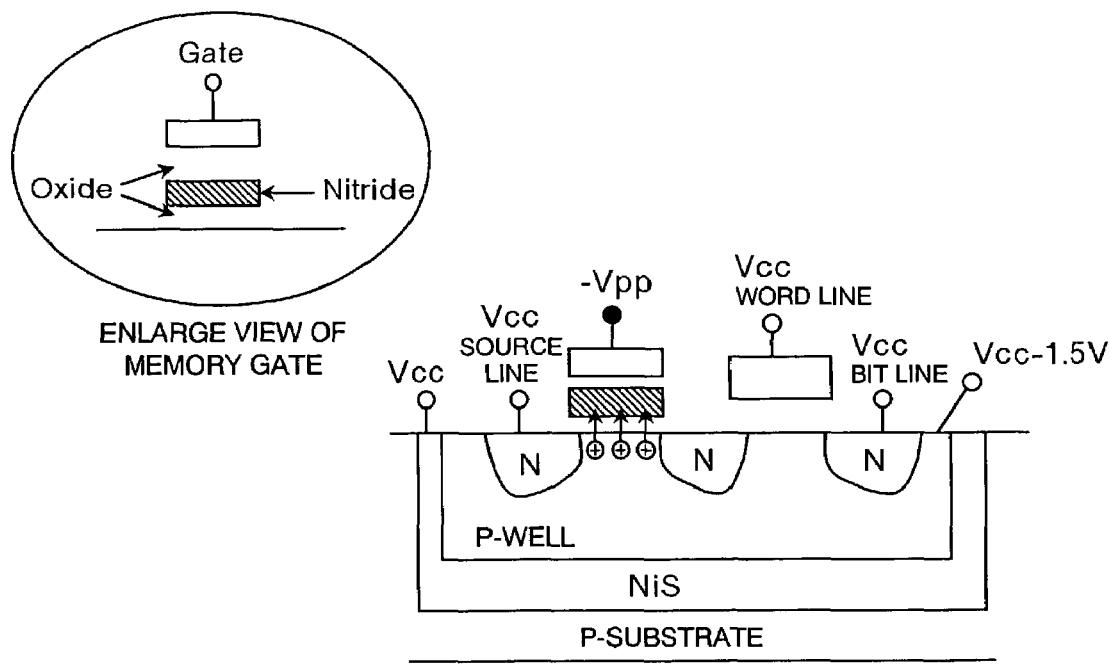
FIG. 3 is a diagram illustrating the erase operation data "1".
Figure 4:
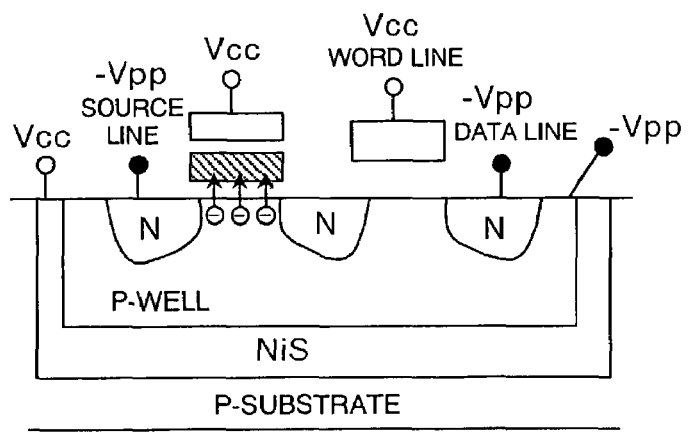
FIG. 4 is a diagram illustrating the program operation data "0".
Figure 5:
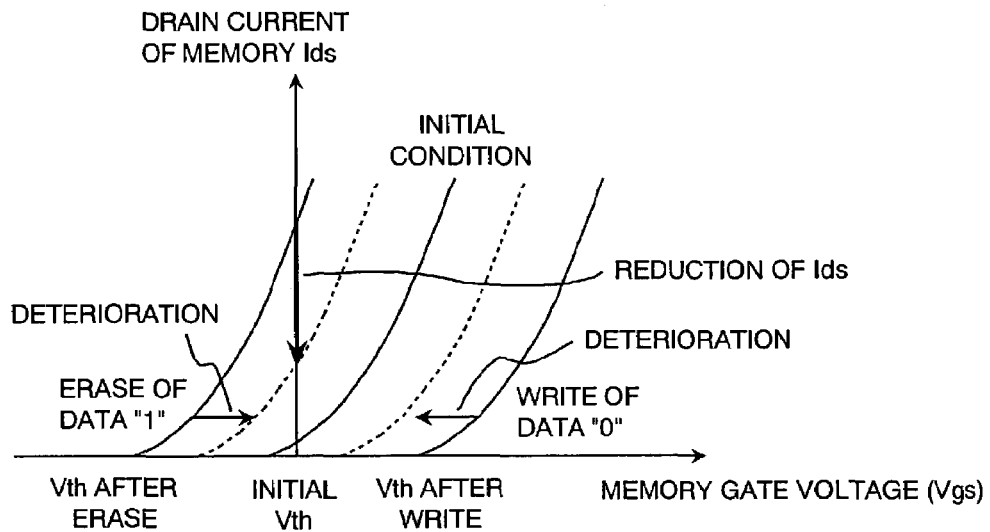
FIG. 5 is a diagram illustrating Vth of memory element.
Figure 6:
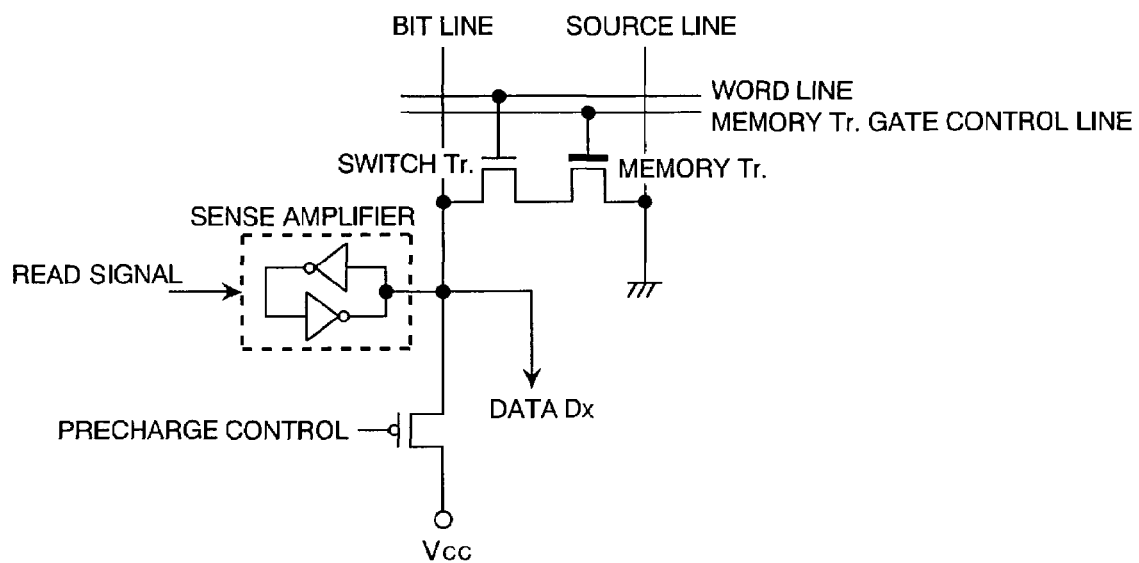
FIG. 6 is an existing memory read circuit diagram.
Figure 8:
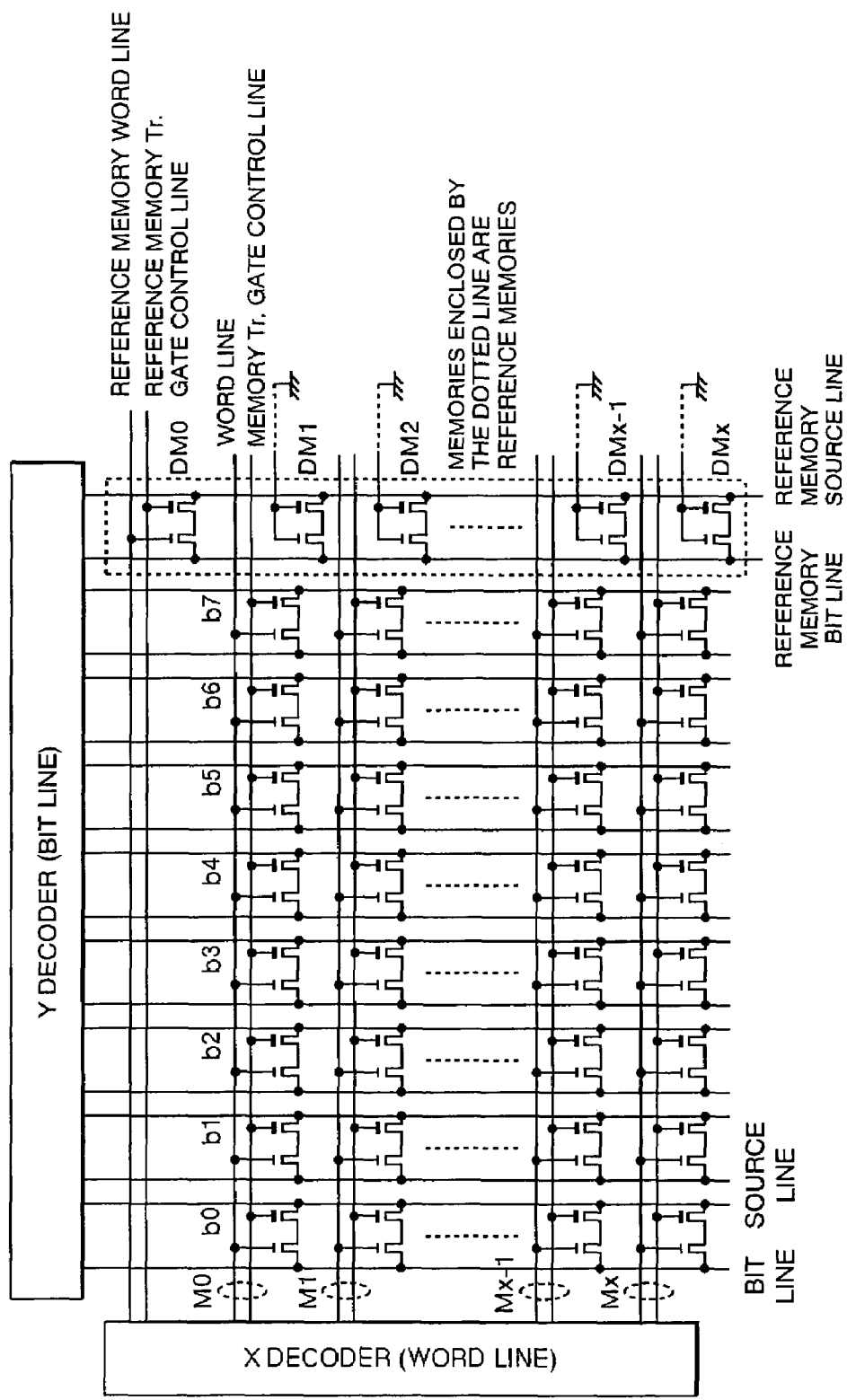
FIG. 8 is a structural diagram of a memory array of the first embodiment of the present invention.

A semiconductor memory array block of the first embodiment of the present invention is illustrated in FIG. 8. As can be understood from the prior art of FIG. 2, reference memories are allocated within a block. According to an example of FIG. 8, a DM0 reference memory allocated in the most significant bit of an X decoder is simultaneously reprogrammed or erased whenever the memory in the block is reprogrammed or erased. In order to reprogram and erase the relevant reference memory as explained above, the word line exclusive for the reference memory, reference memory transistor gate control line, reference memory bit line and reference memory source line are controlled. Thereby, the reference memory DM0 is always set to erase "1" state.

Figure 9A:
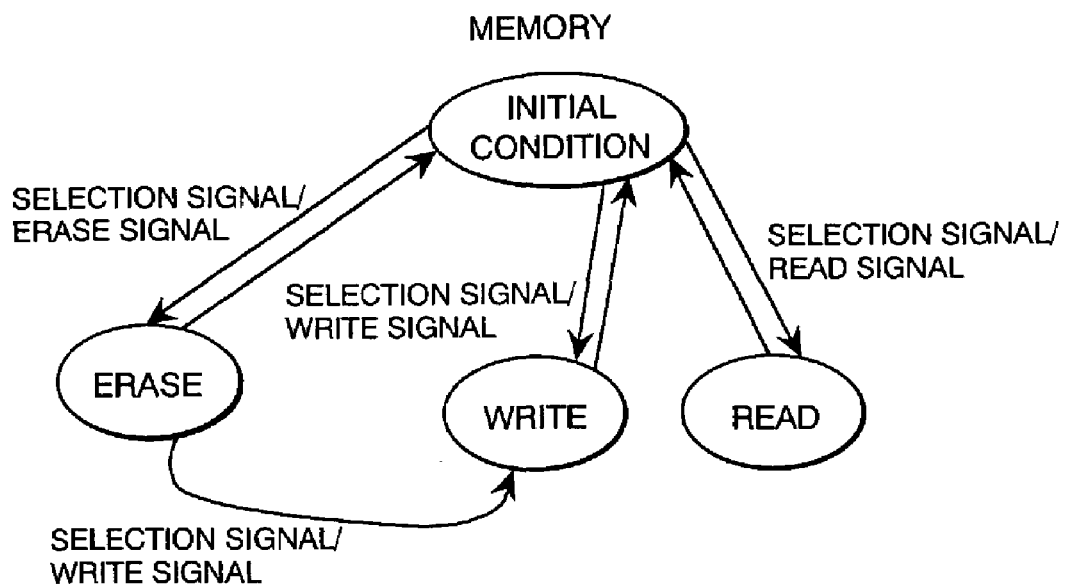
FIG. 9 (a) is a status transition diagram of memory and FIG. 9 (b) is a status transition diagram of reference memory.
Figure 9B:
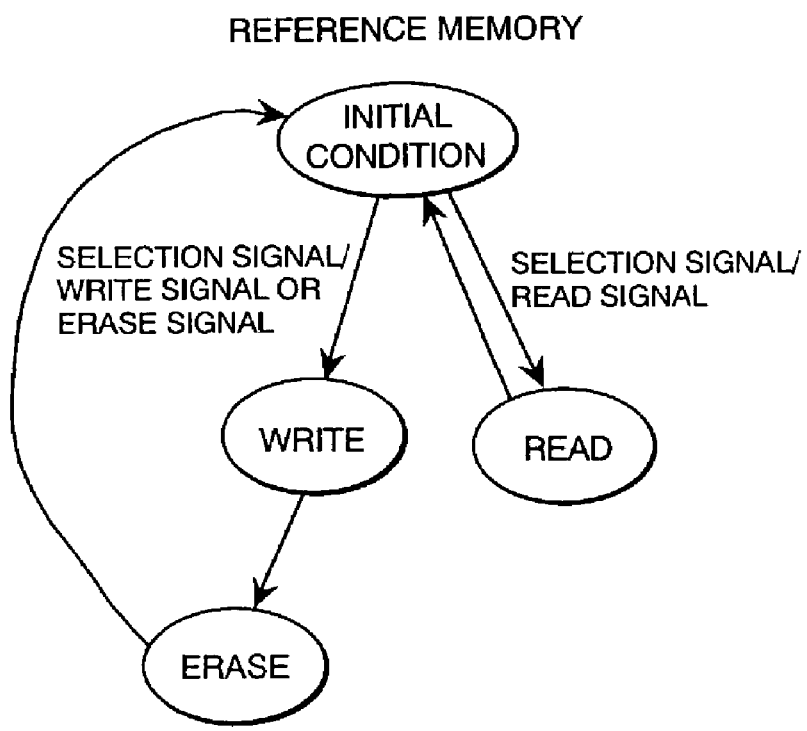

This profile will be explained with the status transition diagrams of FIG. 9 (a) and FIG. 9 (b). In FIG. 9 (a), a memory is shifted to the state of the signals depending on the selection signal, read signal, write signal and erase signal outputted from an external controller or the like. However, in FIG. 9 (b), the reference memory once shifts to the write state when the selection signal, write signal or erase signal is inputted from the relevant external controller. Thereafter, the reference memory shifts to the erase state and then returns to the initial state (namely, the erase state) as is set previously.

The reference memories of DM1 to DMx allocated under the reference memory at the most significant bit are allocated for matching with the resistance and capacitance of the bit line and source line of memory which are important factors for read operation. The word lines of reference memories DM1 to DMx and the reference memory transistor gate control line are always grounded to GND.

Thereby, since the DM0 is surely erased for reprogram when the memory in the block is reprogrammed, the number of times of reprogram for the DM0 reaches the maximum number of times of reprogram in the block. Namely, deterioration of Vth of the DM0 memory transistor is worse than deterioration of the memory. Moreover, application years of memory is equal to that of the reference memory DM0.

The reference memory of the DM1 to DMx plays a role of parasitic capacitance of the reference memory bit lines. Since the DM1 to DMx are provided, the voltage drop of the bit line of the reference memory indicated in the graphs of FIG. 11 (a) and FIG. 11 (b) is rather slower than that of memory bit line and therefore the longer read timing of the reference memory which is longer than that of the memory can always be set.

Moreover, the initial Vth of DM0 is set a little higher than the memory considering a read margin and a little higher than the erase Vth of the memory when data is erased. As a method of setting the initial Vth to a higher value, a process condition of the reference memory transistor is changed or the Vth value is virtually raised by reducing the initial drain current Ids through the change of channel length L or channel width W. In this case, any method desired may be introduced. Moreover, as a method of obtaining a read margin, the threshold value of a sense amplifier of the reference memory is lowered. In addition, when Vth value is not almost fluctuated in the reference memory and memory, it is not required to set the initial Vth of the reference memory to a higher value.

Figure 10:
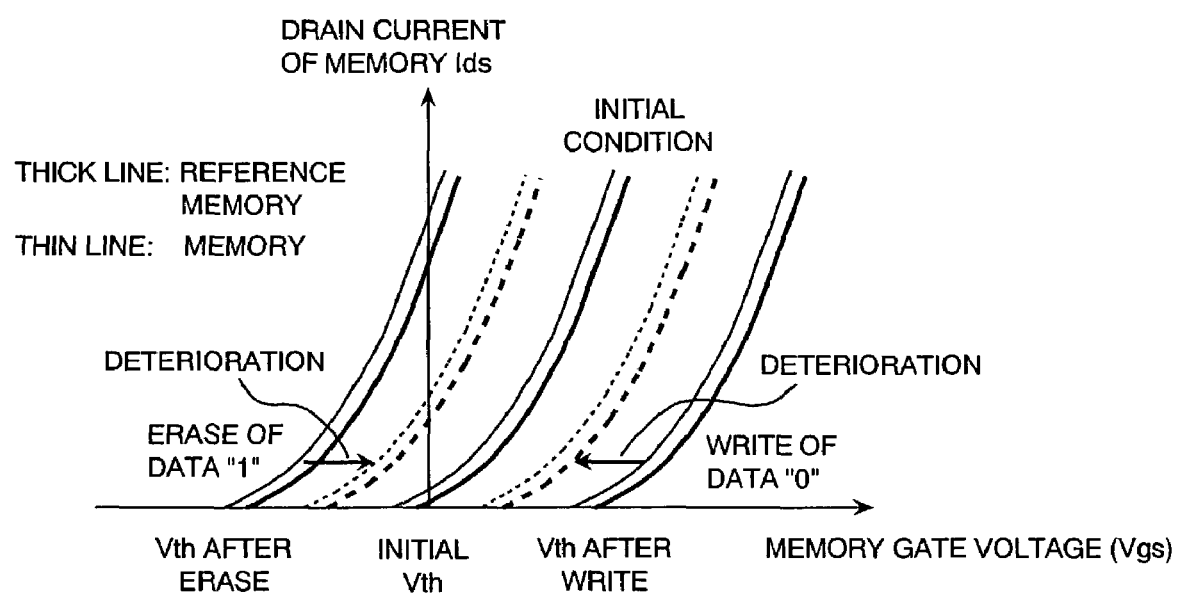
FIG. 10 illustrates Vth of memory element and Vth of reference memory.

FIG. 10 illustrates Vth values of the reference memory and memory. The Vth value of the reference memory is always higher than Vth value of the memory. In actual, the reference memory DM0 is always set to the Vth after erase at the time of read operation. When the memory and reference memory DM0 are read simultaneously under this condition, the Vth value after erase of the DM0 becomes higher than the Vth after erase. Accordingly, since the reference memory drain current Ids is less than the memory current Ids, the read time of the reference memory is a little longer than the read time of memory.

The accurate read timing of the memory can be generated by utilizing the read timing of the reference memory for the control of the read timing of the memory. Moreover, even when the Vth value of memory becomes higher due to deterioration through reprogram and application years, the read timing of the reference memory can be used because the reference memory DM0 is deteriorated.

Figure 11A:
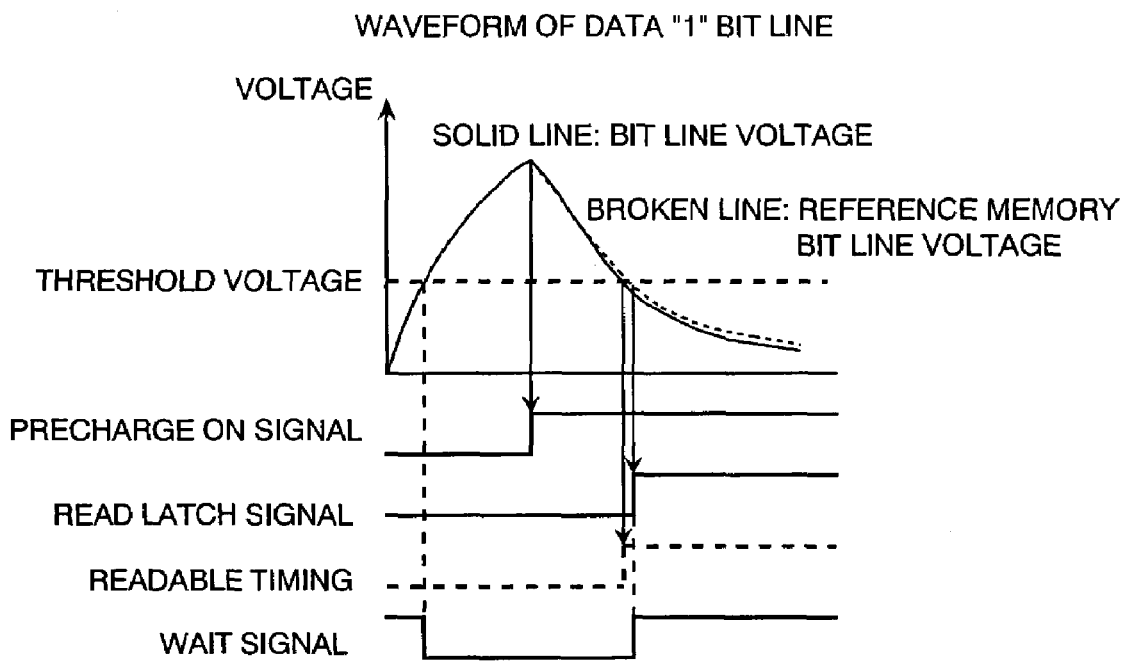
FIG. 11 (a) illustrates a read timing when deterioration of memory is rather small and FIG. 11 (b) illustrates a read timing when deterioration of memory is rather large.
Figure 11B:
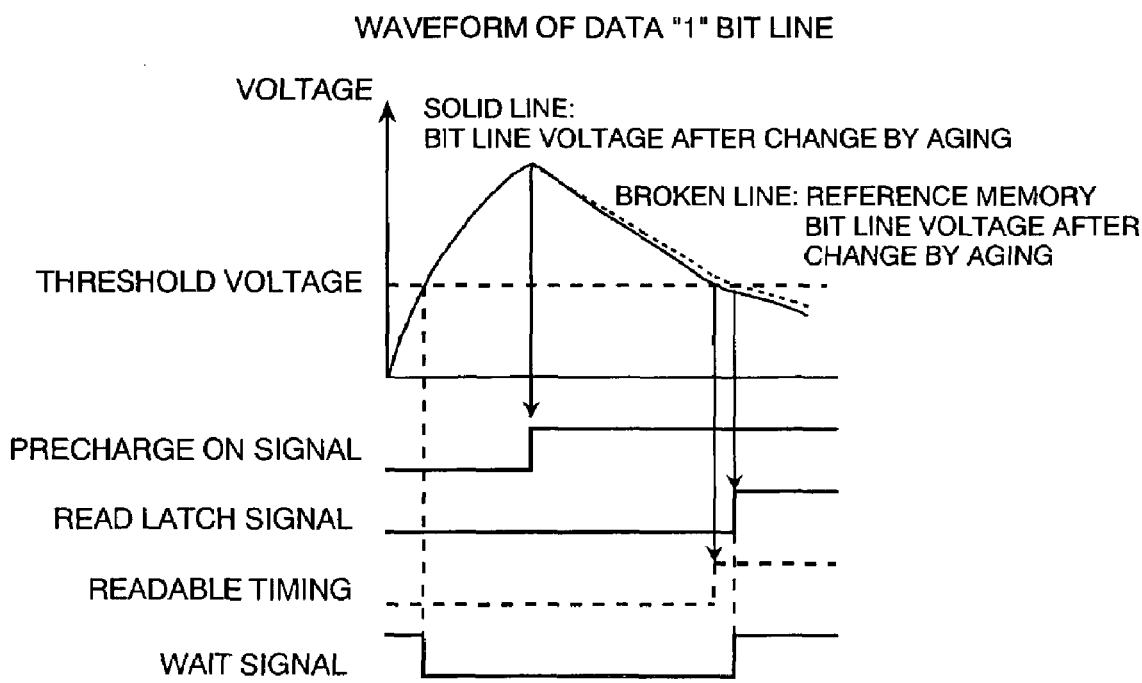

The profile is illustrated in FIG. 11 (a) and FIG. 11 (b). Characteristic of the read timing in the present invention indicated by the graphs of FIG. 11 (a) and FIG. 11 (b). Since the reference memory is provided, when deterioration due to reprogram and application years of memory is rather small, voltage drop of the reference memory bit line becomes fast as illustrated in FIG. 11 (a) and thereby read timing also becomes fast. Moreover, when deterioration of memory is rather large, voltage drop of the reference memory bit line becomes slow and thereby the read timing is also delayed. Namely, the read timing can be generated depending on a degree of deterioration of memory.

Figure 7:
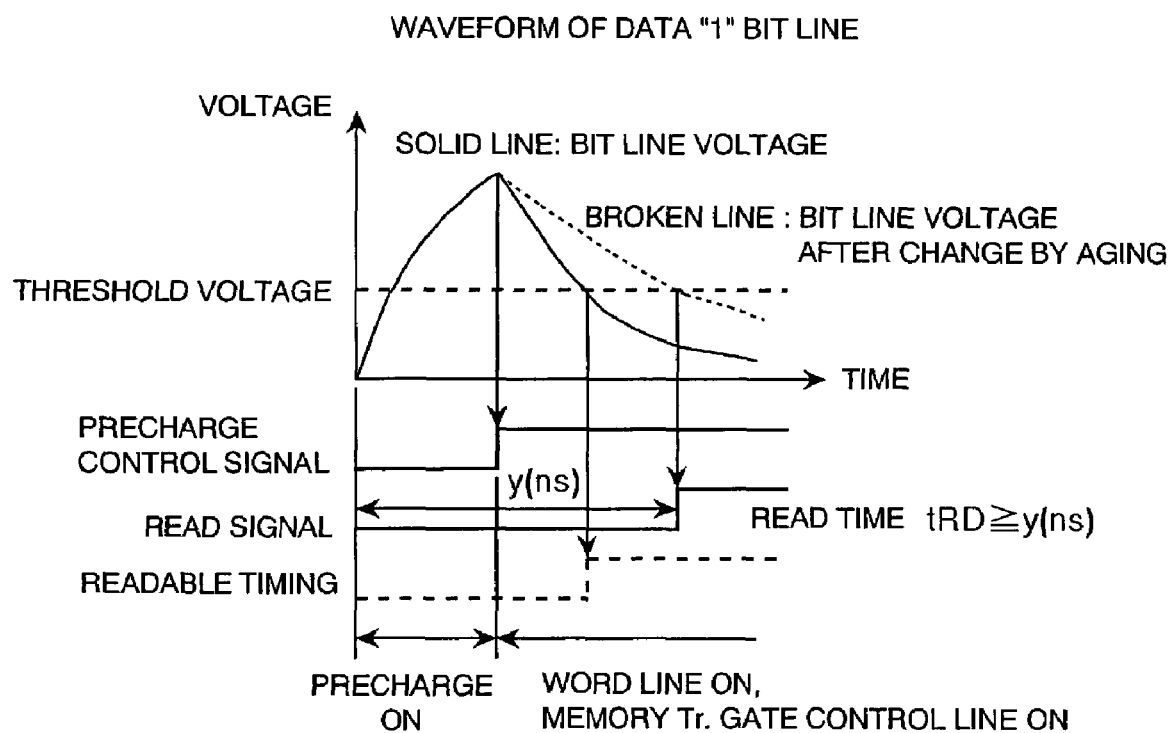
FIG. 7 is a diagram illustrating an existing memory read timing.

Difference between the graph of FIG. 7 indicating the prior art example and the graph indicating the read timing in the present invention of FIG. 11 is addition of a wait signal. Characteristic of the wait signal will be explained later in combination of the explanation about the read timing generating circuit of FIG. 12.

Figure 12:
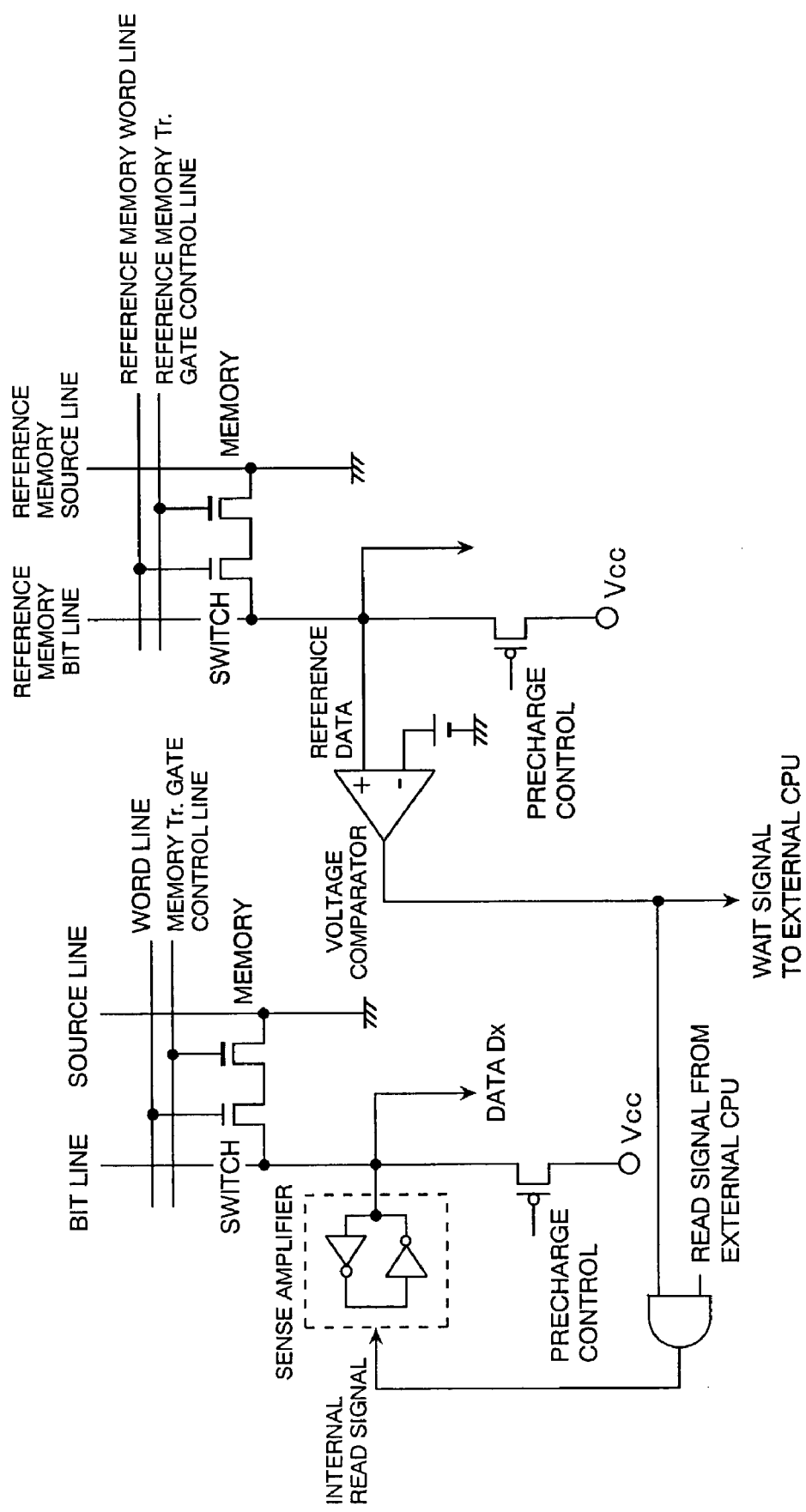
FIG. 12 a read timing generating circuit diagram of the present invention.

FIG. 12 illustrates a circuit for generating the read timing of memory from the read timing of reference memory. Function of this read timing generating circuit will be explained below.

The precharge control signals of reference memory side and memory side are simultaneously turned ON. The power supply Vcc is applied to the bit line and reference memory bit line and thereby the bit line and reference memory bit line voltages rise. The precharge control signal is turned OFF and simultaneously the word line, reference memory word line, memory Tr. gate control line, reference memory Tr. gate control line are turned ON. Thereafter, the charges on the reference memory bit line flow into the reference memory switch and reference memory to drop the bit line voltage.

The relevant voltage drop is compared in a voltage comparator provided in the reference memory side. Voltage drop for the reference voltage connected to the positive side of the voltage comparator is detected with the voltage comparator. When voltage drop is higher than the reference voltage, the wait signal (LOW signal) is outputted to an external CPU to set an output of the read signal from the CPU to the waiting state.

When the read signal changes to HIGH from LOW due to the AND logic of wait signal and read signal, voltage drop in the memory side is detected with the sense amplifier to sense the data ("0" or "1"). The effect of provision of the reference memory of the present invention in unit of the block of memory array will be explained from the circuit of FIG. 12. When it is difficult to judge whether the contents of memory is "0" or "1", the reference memory shall always be set to the erase state "1".

When the voltage drop of reference memory bit line is detected as illustrated in FIG. 12, the internal read signal can be turned ON and the data of memory bit line can be read by utilizing the sense amplifier.

A method of controlling the read timing of memory with the read timing generating circuit (FIG. 12) explained above can also be provided as a reading method having the characteristics of items (1) to (4) explained below.

(1) A reading method in a semiconductor integrated circuit device consisting of a non-volatile semiconductor memory array wherein a reference memory is disposed in unit of block of memory to be erased or programmed and a part of a plurality of bit lines provided for every block is connected to the reference memory as the reference memory bit line and a CPU to supply a read signal, a program signal or an erase signal to such memory array; the method comprising the steps of setting the reference memory to the erase state to detect voltage drop of the reference memory bit line, outputting the result of detection as a holding signal to the CPU to hold the supply of the read signal to the memory array and acquiring the data stored in the memory.

(2) A reading method described in the item (1) wherein the holding signal is a wait signal which is supplied to the memory array from the CPU to set an output of the read signal in the waiting condition.

(3) A reading method described in the item (1) wherein the memory array is provided with a voltage comparator including the reference voltage to compare, in the step of detection, the reference voltage with the voltage drop in order to detect the voltage drop.

(4) A reading method described in the item (1) wherein the memory array is provided with a sense amplifier for acquiring the data within the memory and supplies, in the step of acquiring, the read signal after the end of the holding signal to the sense amplifier as the internal read signal in order to acquire the data stored in the memory with the sense amplifier.

Figure 16:
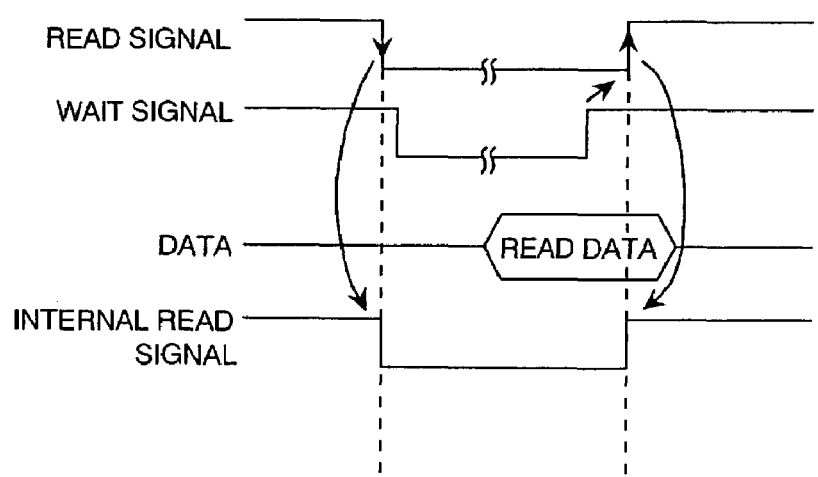
FIG. 16 is a time chart of read signal, wait signal and internal read signal between the structural diagram of memory array of FIG. 15 and the CPU.

Relationship between the graph of read timing of the present invention and the read timing generating circuit of FIG. 12 illustrated in FIG. 11 (a) and FIG. 11 (b) will be explained. The wait signal (LOW signal) indicated in the graphs of FIG. 11 (a) and FIG. 11 (b) is outputted to the CPU from the memory array to set an output of the read signal to the waiting condition. When the wait signal changes to the HIGH level from the LOW level, the read signal also changes to the HIGH level as illustrated in the timing chart of FIG. 16. With the AND logic of the wait signal and read signal, the internal read signal turns ON, the sense amplifier operates, voltage drop in the memory side is detected and the data is then read.

As explained above, even when the memory is deteriorated, accurate read timing can be generated by utilizing the read timing of the reference memory as the read timing of memory. Moreover, the memory of the prior art requests the read timing considering deterioration thereof to the external controller and even when the memory is not deteriorated, the specification same as that in the read timing when deterioration is generated has been set. In comparison with the specification of the prior art, the read timing obtained from the reference memory is based on generation of the wait signal illustrated in FIG. 12. With introduction of structure where the wait signal is outputted to the external CPU, when deterioration of memory is not generated, the external controller (CPU) or the like detects its wait signal and quickly turns ON the read signal in order to realize high speed read operation.

Moreover, when the memory is deteriorated, it can be detected that the read operation cannot be realized even when the external controller or the like tries to turn ON the read signal because the wait signal is yet in the active state.

Figure 13:
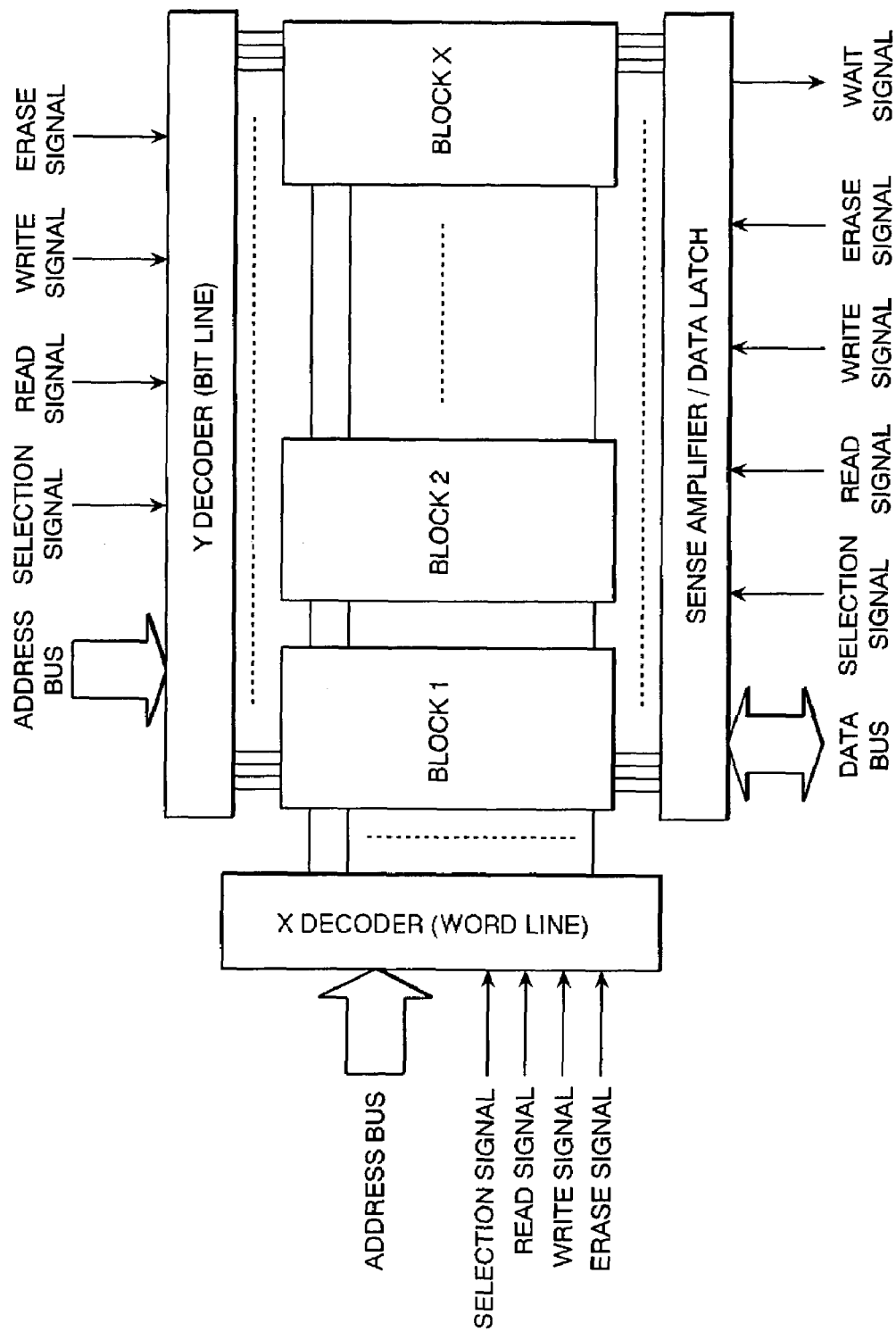
FIG. 13 is a structural diagram of memory array of the present invention.
Figure 15:
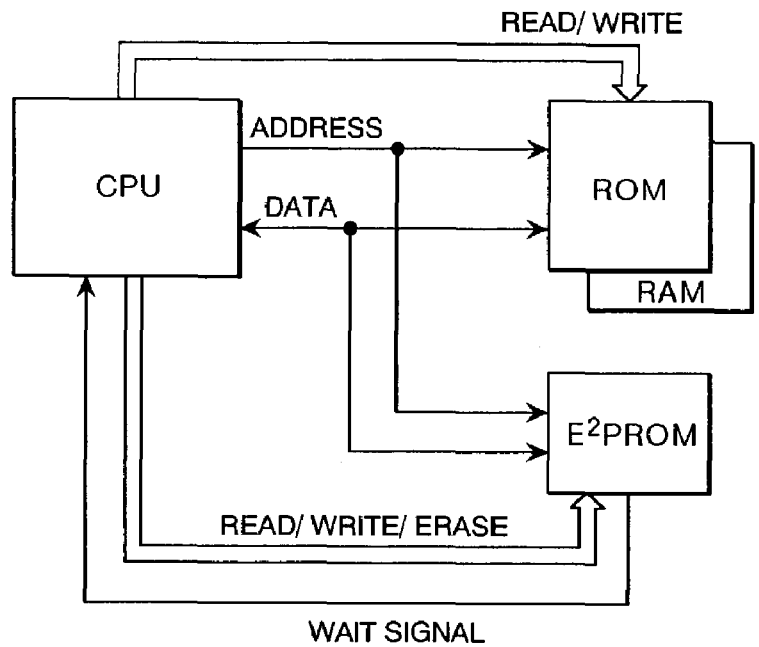
FIG. 15 is a diagram illustrating access of read, write, erase signals and a wait signal between the structural diagram of memory of FIG. 13 and a CPU.

An external structure of memory array of the present invention is illustrated in FIG. 13. Moreover, a structure of memory array of FIG. 13 including the CPU is illustrated in FIG. 15. The EEPROM (FIG. 15) corresponds to sense amplifier. and data latch, blocks 1 to X and X decoder (word line, bit line) in the memory array structure of FIG. 13. With the wait signal from the memory array, output of the read, write and ease signals is controlled.

Difference from the memory array structure of the prior art of FIG. 1 is that the wait signal is outputted from the memory array to notify the read identifying state.

Figure 14:
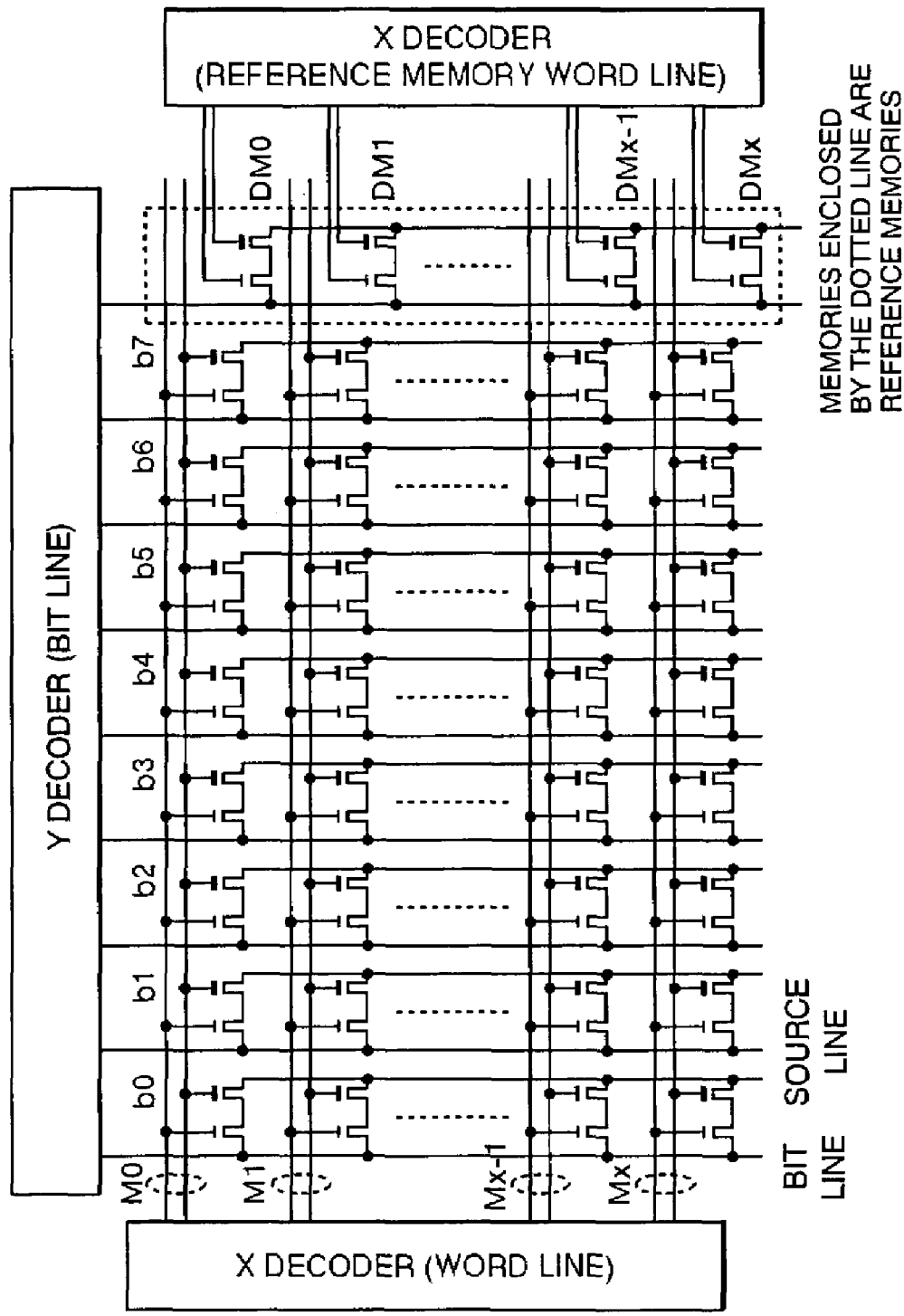
FIG. 14 is a structural diagram of memory array of the second embodiment of the present invention.

FIG. 14 illustrates a memory block of the second embodiment. Like the first embodiment illustrated in FIG. 8, the reference memory is allocated within the block. Difference from the first embodiment of FIG. 8 will be explained below. In FIG. 8, whenever the memory in the block is erased and programmed, the reference memory DM0 is reprogrammed and erased. Moreover, when the memory in the block is read, the DM0 is read. In the second embodiment of FIG. 14, an X decoder for reference memory is prepared to synchronously select the X decoder in the block and X decoder for reference memory.

For example, when the M0 is selected with the X decoder for erase and program, the DM0 is selected, programmed and erased with the X decoder for reference memory. In the same manner, when the M0 is selected during the read operation, the DM0 is also selected. Here, when the program (write) and read operations for the DM0 are selected, read and program operations for DMx from DM1 are not executed. In this case, since the DM which is not the object of the read and program operations remains in the OFF state, an equivalent circuit as a capacitor C having a floating capacitance can be obtained.

Accordingly, the memory block of the second embodiment can substantially be considered to have the circuit structure from the reference memory DM0 to DMx of FIG. 8 explaining the first embodiment of the present invention.

Since the reference memory is selected depending on the X decoder (word line) as explained above, deterioration of the reference memory can be generated more accurately than that of the structure of FIG. 8 depending on deterioration of memory and therefore the read timing used for the reference memory can be set more closely to the actual read timing of memory.

The characteristics of the non-volatile semiconductor memory array based on the first and second embodiments of the present invention have been explained above. Moreover, however, the memory array of the embodiments explained above can also be provided as the non-volatile semiconductor memory array having the characteristics explained in the following items (a) to (g).

(a) A non-volatile semiconductor memory array characterized by consisting of a non-volatile semiconductor memory array wherein the reference memory is allocated in unit of block to be erased or programmed in order to control the read timing for a plurality of memories provided in the memory arrange by utilizing information about the read timing obtained from the reference memory.

(b) A non-volatile semiconductor memory array described in item (a) characterized by that an information about read timing is an information about read timing based on deterioration of the reference memory and an information about reduction of a memory current of the reference memory.

(c) A non-volatile semiconductor memory array described in item (a) characterized by that the program and erase operations are executed to the reference memory whenever a part of a plurality of memories are erased or programmed.

(d) A non-volatile semiconductor memory array described in item (a) characterized by that the memory array is provided with a sense amplifier, a CPU is provided adjacent to the memory array and when the CPU executes the read operation to the sense amplifier, a voltage comparator provided in the sense amplifier outputs a wait signal to the CPU in order to control the read timing.

(e) A non-volatile semiconductor memory array described in item (a) characterized by that the initial threshold value of the reference memory is set higher than the initial threshold value of the memory.

(f) A non-volatile semiconductor memory array described in item (d) characterized by that operation timing is determined depending on a degree of deterioration of the memory utilizing the read timing controlled with the wait signal.

(g) A non-volatile semiconductor memory array described in item (a) characterized by that the read timing obtained from the reference memory can be set more closely to the read timing for the memory by providing the reference memory for every byte of a plurality of memories for the same memories included in the block to be erased or programmed.

Moreover, the present invention can provide the non-volatile semiconductor memory array based on the first and second embodiments and the relevant memory array having the characteristics described in items (a) to (g), and can also provide the non-volatile semiconductor memory array having the characteristics described in items (i) to (iii).

(i) A non-volatile semiconductor memory array which is structured by a non-volatile semiconductor memory array provided with the reference memories for every block including a plurality of memories to be read, programmed or erased, characterized by that the memory array is further provided with a sense amplifier and the read timing information obtained from the reference memory is detected with a detection circuit provided in the sense amplifier and is then outputted to an external controller as a holding signal in view of holding the supply of read signal from the controller and controlling the read timing of the memory.

(ii) A non-volatile semiconductor memory array described in item (i), characterized by that the sense amplifier is connected to a plurality of memories and reference memories with a plurality of bit lines and a drop of voltage as the read timing information of the bit lines connected to the reference memories is detected with the detecting circuit and is then outputted to the controller as the holding signal.

(iii) A non-volatile semiconductor memory array described in item (ii), characterized by that the sense amplifier is provided with a data latch circuit and the data in the memory can be fetched by supplying the read signal as the internal read signal to the data latch circuit after the end of the holding signal.

The non-volatile semiconductor memory array of the present invention is provided with the reference memories to result in the effects to assure highly reliable read operation that the reference memories are provided to the non-volatile semiconductor memory array to generate the read timing from the relevant reference memories, thereby the read timing can be generated depending on deterioration of memories, high speed read operation can be realized when the memories are not deteriorated and the read timing can internally be generated, when the memories are deteriorated, depending on deterioration.

What is claimed is:

1. A non-volatile semiconductor memory device comprising:
    a nonvolatile semiconductor memory array;
    a plurality of data memories; and
    reference memories allocated within units of blocks to be erased or programmed,
    wherein read timing for said plurality of data memories is controlled by utilizing read timing information obtained from said reference memories, and
    wherein said read timing information is related to deterioration of said reference memories and a reduction of a current of said reference memories based on said deterioration.

2. A non-volatile semiconductor memory device according to claim 1, wherein whenever a part of said plurality of data memories is erased or programmed a corresponding one of said reference memories is erased or programmed.

3. A non-volatile semiconductor memory device according to claim 1, wherein said memory array is provided with a sense amplifier,
    a CPU is provided adjacent to said memory array and when said CPU executes a read operation to said sense amplifier, a voltage comparator provided in said memory array outputs a wait signal to control the read timing to said CPU.

4. A non-volatile semiconductor memory device according to claim 1, wherein each of said reference memories is set to an initial threshold value higher than an initial data memory threshold value.

5. A non-volatile semiconductor memory device according to claim 3, wherein the read operation timing is determined depending on a degree of deterioration of a data memory using the read timing controlled with said wait signal.

6. A non-volatile semiconductor memory device according to claim 1, wherein a reference memory is provided for every byte of said data memories included in a block to be erased or programmed.

7. A reading method performed in a semiconductor memory device, the semiconductor integrated memory device comprising:
    a non-volatile semiconductor memory array, wherein a plurality of reference memories are allocated in units of blocks of memory to be erased or programmed, and some of a plurality of bit lines provided for said blocks are connected to said reference memories as reference memory bit lines, and a CPU for supplying a read, program or erase signal to said memory array, said reading method comprising the steps of:

detecting a voltage drop of a reference memory bit line by setting a corresponding one of said reference memories to an erase state;

holding a supply of said read signal to said memory array by outputting a result of said detecting to said CPU as a holding signal; and acquiring stored data from said memory array after the end of said holding signal.

8. A reading method according to claim 7, wherein said holding signal is a wait signal for controlling said CPU to wait for outputting of said read signal to be supplied to said memory array.

9. A reading method according to claim 7, wherein said memory array is provided with a voltage comparator to compare, in said detecting step, a reference voltage with said voltage.

10. A reading method according to claim 7, wherein said memory array is provided with a sense amplifier for acquiring data from said memory array in said acquiring step, and said read signal is supplied to said sense amplifier as an internal read signal after the end of said holding signal for acquiring the data.

11. A non-volatile semiconductor memory device comprising:

a non-volatile semiconductor memory array having a plurality of reference memories for respective blocks of data memory to be read, programmed or erased, said memory array being further provided with a sense amplifier, wherein read timing information obtained from said plurality of reference memories is detected with a detection circuit included in said sense amplifier, and supply of a read signal from an external controller is held by outputting said information to said external controller in order to control read timing of said data memory.

12. A non-volatile semiconductor memory array according to claim 11, wherein said sense amplifier is connected to said data memory and to said plurality of reference memories with a plurality of bit lines, and a voltage drop as said read timing information of said bit lines connected to said reference memories is detected with said detection circuit and a holding signal is outputted to said external controller depending upon the detected voltage drop.

13. A non-volatile semiconductor memory device according to claim 12, wherein said sense amplifier is provided with a data-latch circuit for fetching data within said memory array by supplying said read signal to said memory array as an internal read signal after the end of said holding signal.

* * * * *